[12] United States Patent
Sveinsson et al.

(10) Patent No.: US 9,389,294 B2
(45) Date of Patent: Jul. 12, 2016

(54) DISTORTION-FREE MAGNETIC RESONANCE IMAGING NEAR METALLIC IMPLANTS

(71) Applicant: The Board of Trustees of the Leland Stanford Junior University, Palo Alto, CA (US)

(72) Inventors: Bragi Sveinsson, Stanford, CA (US); Brian A. Hargreaves, Menlo Park, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 668 days.

(21) Appl. No.: 13/796,979

(22) Filed: Mar. 12, 2013

(65) Prior Publication Data

US 2014/0266191 A1 Sep. 18, 2014

(51) Int. Cl.
*G01R 33/565* (2006.01)
*G01R 33/561* (2006.01)

(52) U.S. Cl.
CPC ........ *G01R 33/56563* (2013.01); *G01R 33/561* (2013.01); *G01R 33/5611* (2013.01)

(58) Field of Classification Search
CPC ............. G01R 33/561; G01R 33/5611; G01R 33/56563
See application file for complete search history.

(56) References Cited

U.S. PATENT DOCUMENTS

| | | | | |
|---|---|---|---|---|
| 4,843,322 A | | 6/1989 | Glover | |
| 5,049,820 A | * | 9/1991 | Briand | G01R 33/4833 324/309 |
| 5,122,748 A | * | 6/1992 | Oh | G01R 33/4833 324/307 |
| 5,270,654 A | * | 12/1993 | Feinberg | G01R 33/5615 324/307 |
| 5,402,787 A | * | 4/1995 | Van Yperen | G01R 33/5615 324/309 |
| 5,410,249 A | * | 4/1995 | Van Yperen | G01R 33/5615 324/307 |
| 5,450,010 A | * | 9/1995 | Van Der Meulen | G01R 33/56518 324/309 |
| 5,455,512 A | * | 10/1995 | Groen | G01R 33/56518 324/309 |
| 5,570,019 A | * | 10/1996 | Moonen | G01R 33/4833 324/307 |
| 5,786,692 A | * | 7/1998 | Maier | G01R 33/56341 324/307 |
| 5,903,149 A | * | 5/1999 | Gonen | G01R 33/485 324/307 |
| 7,535,227 B1 | | 5/2009 | Koch et al. | |
| 7,602,184 B2 | * | 10/2009 | Du | G01R 33/4824 324/307 |
| 7,627,359 B2 | * | 12/2009 | Yarnykh | G01R 33/5607 324/307 |
| 7,777,488 B2 | * | 8/2010 | Gore | G01R 33/4824 324/307 |
| 7,928,729 B2 | * | 4/2011 | Hargreaves | G01R 33/4833 324/307 |
| 8,064,982 B2 | * | 11/2011 | Hu | G01R 33/46 324/307 |
| 8,143,889 B2 | * | 3/2012 | Jeong | G01R 33/5616 324/307 |

(Continued)

OTHER PUBLICATIONS

David C. Alsop, "The Sensitivity of Low Flip Angle RARE Imaging," MRM 37:176-184 (1997.

(Continued)

*Primary Examiner* — Dixomara Vargas
(74) *Attorney, Agent, or Firm* — Beyer Law Group LLP

(57) ABSTRACT

A method for 3D magnetic resonance imaging (MRI) with slice-direction distortion correction is provided. One or more selective cross-sections with a thickness along a first axis are excited using a RF pulse with a bandwidth, wherein a selective cross-section is either a selective slice or selective slab. A refocusing pulse is applied to form a spin echo. One or more 2D encoded image signals are acquired with readout along a second axis and phase encoding along a third axis, wherein the data long the phase encoded first and third axes is acquired with an under sampling scheme. Slice-direction distortion is corrected by resolving the position by using phase encoding.

19 Claims, 11 Drawing Sheets

(56) References Cited

U.S. PATENT DOCUMENTS

| | | | |
|---|---|---|---|
| 8,274,286 B2 | 9/2012 | Koch et al. | |
| 8,406,849 B2* | 3/2013 | Jeong | G01R 33/5615 324/300 |
| 8,791,700 B2* | 7/2014 | Witschey | G01R 33/4833 324/307 |
| 8,872,515 B2* | 10/2014 | Sun | G01R 33/50 324/307 |
| 9,113,810 B2* | 8/2015 | Edelman | A61B 5/055 |
| 9,119,955 B2* | 9/2015 | Zur | A61N 7/02 |
| RE45,725 E * | 10/2015 | Mugler, III | |
| 9,176,212 B2* | 11/2015 | Edelman | G01R 33/5635 |
| 2014/0266191 A1* | 9/2014 | Sveinsson | G01R 33/56563 324/309 |

OTHER PUBLICATIONS

Butts et al., "Management of Biopsy Needle Artifacts: Techniques for RF-Refocused MRI," Journal of Magnetic Resonance Imaging, 9:586-595 (1999).

Cho et al., "Total inhomogeneity correction including chemical shifts and susceptibility by view angle tilting," Med. Phys. 15(1), Jan./Feb. 1988, pp. 7-11.

Daniel et al., "The use of view angle tilting to reduce distortions in magnetic resonance imaging of cryosurgery," Magnetic Resonance Imaging, 18:281-286 (2000).

Duerk et al, "Pulse Sequences for Interventional Magnetic Resonance Imaging," Topics in Magnetic Resonance Imaging, 11(3): 147-162 2000.

Gravina et al., "Sensitivity and Resolution of constant-Time Imaging," Journal of Magnetic Resonance, Series B 104, 53-61 (1994).

Kolind et al., "Quantitative Evaluation of Metal Artifact Reduction Techniques," Journal of Magnetic Resonance Imaging 20:487-495 (2004).

Lee et al., "Quantitative assessment of an MR technique for reducing metal artifact: application to spin-echo imaging in a phantom," Skeletal Radiol 30:398-401, 2001.

Malfair et al., "Imaging the Degenerative Diseases of the Lumbar Spine," Magnetic Resonance Imaging Clinics N Am, 15:221-238, (2007).

McGowan et al., "Reduction of Image Distortion in Presence of Metal," Proceedings of the Fifth Annual Scientific Meeting of the International Society for Magnetic Resonance in Medicine , Vancouver, Canada, Apr. 12 18, 1997, 1 page.

Noll et al., "Homodyne Detection in Magnetic Resonance Imaging," IEEE Transaction on Medical Imaging, vol. 10, No. 2, Jun. 1991.

Olsen et al. "Metal Artifact Reduction Sequence: Early clinical Applications," RadioGraphics, 20:699-712, 2000.

Posse et al., "Three-dimensional Echo-planar MR Spectroscopic Imaging at Short Echo Times in the Human Brain," Radiology 192:733-738, 1994.

Pruessmann et al., "SENSE: Sensitivity Encoding for Fast MRI," Magnetic Resonance in Medicine, 42:952-962 (1999).

Ro et al., "Susceptibility Magnetic Resonance Imaging Using Spectral Decomposition," MRM, 33:521-528, 1995.

Sodickson et al., "simultaneous Acquisition of Spatial Harmonics (SMASH): Fast Imaging with Radiofrequency Coil Arrays," MRM, 38:591-603, 1997.

Yang et al., "Removal of Local Field Gradient Artifacts in $T2^*$-Weighted Images at High Fields by Gradient-Echo Slice Excitation Profile Imaging," MRM, 39:402-409 (1998).

Sveinsson et al., "Fast Imaging of Metallic Implants by Data Subsampling," Proc. Intl. Soc. Mag. Reson. Med. 21, p. 0557, 2013.

Vandevenne et al., "MR Imaging of Orthopedic Prostheses: Metal Artifact Reduction Using View Angle Tilting", Radiological Society of North America, 84th Scientific Assembly and Annual Meeting, Chicago, 1998, p. 465.

Lu et al., "Towards Artifact-free MRI near Metallic Implants," Proc. Intl. Soc. Mag. Reson. Med., 16th ISMRM meeting, 2008, p. 838.

\* cited by examiner

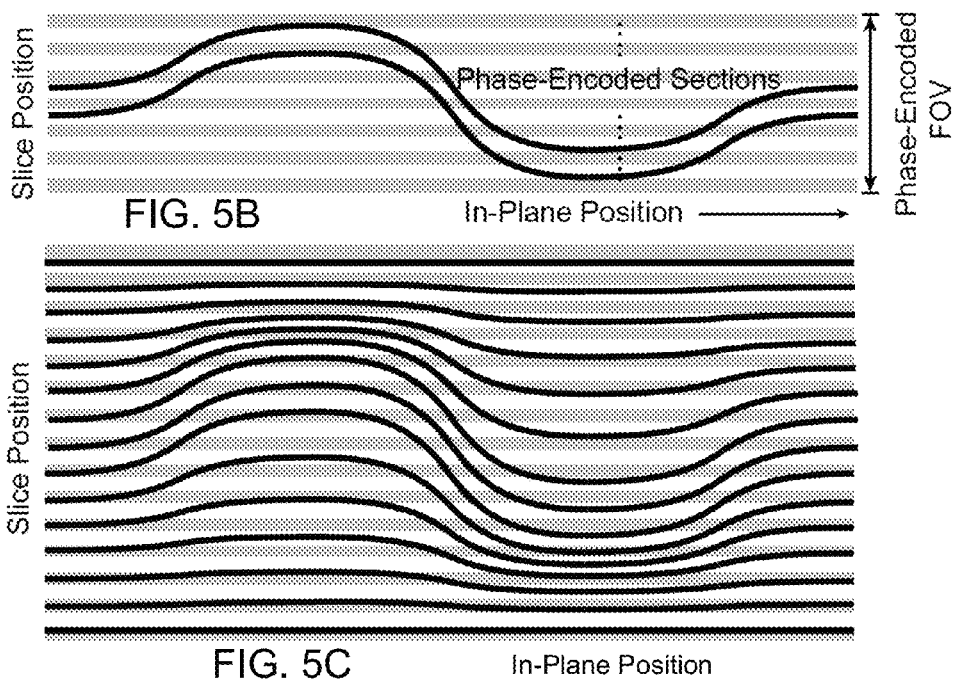
FIG. 5B
FIG. 5C
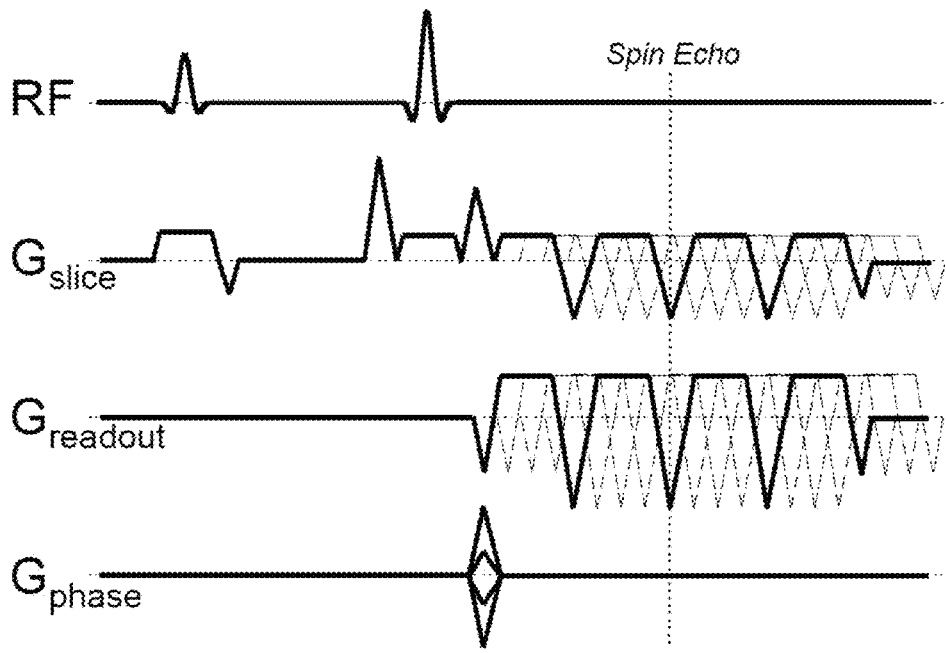
FIG. 6

DISTORTION-FREE MAGNETIC RESONANCE IMAGING NEAR METALLIC IMPLANTS

GOVERNMENT RIGHTS

This invention was made with Government support under contract R01-EB002524 awarded by the National Institute of Health. The Government has certain rights in this invention.

BACKGROUND OF THE INVENTION

This invention relates generally to magnetic resonance imaging (MRI). Magnetic resonance imaging (MRI) is a non-destructive method for the analysis of materials and is an approach to medical imaging. It is generally non-invasive and does not involve ionizing radiation. In very general terms, nuclear magnetic moments are excited at specific spin precession frequencies that are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

Magnetic resonance (MR) imaging is based on nuclear spins, which can be viewed as vectors in a three-dimensional space. During an MRI experiment, each nuclear spin responds to four different effects: precession about the main magnetic field, nutation about an axis perpendicular to the main field, and both transverse and longitudinal relaxation. In steady-state MRI experiments, a combination of these effects occurs periodically.

U.S. Pat. No. 4,843,322 to Glover, issued Jun. 27, 1989, which is incorporated by reference for all purposes, discloses a method for producing multi-slice MRI images. U.S. Pat. No. 7,928,729 to Hargreaves et al., issued Apr. 19, 2011, which is incorporated by reference for all purposes, discloses a distortion-free magnetic resonance imaging near metallic implants.

SUMMARY OF THE INVENTION

In accordance with the invention, a method for 3D magnetic resonance imaging (MRI) with slice-direction distortion correction is provided. One or more selective cross-sections with a thickness along a first axis are excited using a RF pulse with a bandwidth, wherein a selective cross-section is either a selective slice or selective slab. A refocusing pulse is applied to form a spin echo. One or more 2D encoded image signals are acquired with readout along a second axis and phase encoding along a third axis, wherein the data along the phase encoded first and third axes is acquired with an under sampling scheme including "checkerboard" pattern or other options. Slice-direction distortion is corrected by resolving the position using phase encoding.

In another manifestation of the invention, an apparatus for providing 3D magnetic resonance imaging with slice-direction distortion compensation is provided. A magnetic resonance imaging excitation and detection system is provided. A controller electrically is controllably connected to the magnetic resonance imaging excitation and detection system, and comprises a display, at least one processor, and computer readable media. The computer readable media comprises computer readable code for exciting one or more selective cross-sections with a thickness along a first axis using a RF pulse with a bandwidth, wherein a selective cross-section is either a selective slice or selective slab, computer readable code for applying a refocusing pulse to form a spin echo, computer readable code for acquiring one or more 2D encoded image signals with readout along a second axis and phase encoding along a third axis, wherein the data along the phase encoded first and third axes is acquired with an under sampling scheme, computer readable code for correcting slice-direction distortion by resolving the position by using phase encoding, and computer readable code for displaying a 3D magnetic resonance image with slice-direction distortion correction on the display.

The invention and objects and features thereof will be more readily apparent from the following detailed description and appended claims when taken with the drawings.

BRIEF DESCRIPTION OF THE DRAWINGS

FIGS. 5A-C show a SEPI-VAT sequence and graphs of the in-plane position.

FIG. 6 shows an EPSI-VAT imaging sequence.

DETAILED DESCRIPTION OF ILLUSTRATED EMBODIMENTS

Definitions: Selectively excited cross-sections in the specification and claims may either be a selectively excited slice or slab.

An embodiment of the invention accomplishes the purpose of using magnetic resonance imaging to form distortion-free images of tissue near metallic implants.

Magnetic resonance imaging (MRI) is widely regarded as the best imaging modality for evaluating orthopedic conditions such as osteomyelitis, avascular necrosis, tendon or ligamentous injury, bone or soft tissue lesions, spinal nerve root compression, and spinal stenosis. MR imaging is "ideally suited for delineating the presence, extent, and complications of degenerative spinal disease" as described in Malfair D, Beall D., "Imaging the degenerative disease of the lumbar spine," Magn Res Im Clinics North Am 2007; 15:221-238, which is incorporated by reference for all purposes. Unfortunately, in patients with previously implanted metallic hardware, MRI is extremely limited by severe image artifacts.

Figures 1A, 1B, 2:
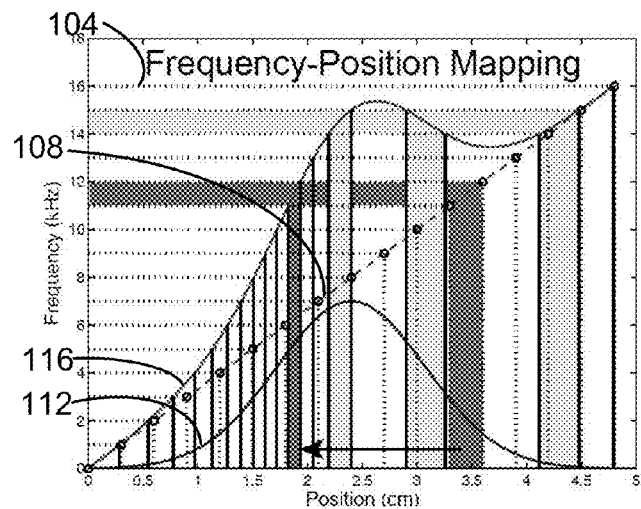
FIGS. 1A-B show the frequency shift of the spins near a metallic implant that results in image distortion.
FIG. 2 shows the view angle tilting pulse sequence that uses a gradient on the slice-select (z) axis during readout that is equal in amplitude to the slice-select gradient, to eliminate in-phase distortion.

The frequency shift of the spins near a metallic implant results in image distortion in two well known manifestations, demonstrated in FIGS. 1A-B. FIG. 1A shows desired slice positions 104 that are mapped linearly to frequency bands by a gradient 108. A frequency variation 112 superimposes on the gradient and changes the frequency-position mapping to that shown by line 116. The result is a position shift including slice misplacement and scaling of slice widths as shown by the darkly shaded regions and arrow. In extreme cases, one RF band can excite multiple regions (lightly shaded regions). Position-encoding during readout can be affected by identical distortion effects. FIG. 1B shows a sagittal spin echo image in a subject with steel screws below the knee that shows the dramatic effects of in-plane distortion (solid arrow), slice displacement (dotted arrow) and slice piling-up artifact (dashed arrow).

Because a gradient is used to map frequency to position, a frequency shift results in errant mapping, and causes a position shift of the source in the image. Such shifts can occur in both the frequency-encoding direction during readout and the slice-select direction during excitation. The magnitude of these two artifacts depends on the shape, size, and material of the metallic implant, as well as imaging methods and parameters.

An embodiment of the invention provides a combination of excitation, imaging and reconstruction techniques that enables distortion-free MR imaging near metallic implants in a clinically-feasible scan time.

An embodiment of the invention builds upon view angle tilting (VAT), originally described in Cho Z, Kim D, Kim Y., "Total inhomogeneity correction including chemical shifts and susceptibility by view angle tilting," Medical Physics 1988; 15:7-11, which is incorporated by reference for all purposes. VAT has been used for reducing metal artifacts around prostheses as described in McGowen A, MacKay A, Xiang Q S., "Reduction of image distortion in the presence of metal," International Society for Magnetic Resonance in Medicine," Vancouver, 1997, Vandevenne J, Heiss S, Butts K, Bergman G, Goodman S, Lang P., "MR imaging of orthopedic prostheses: Metal artifact reduction using view angle tilting," RSNA, Chicago, 1998. p. 465; Olsen R V, Munk P L, Lee M J, Janzen D L, MacKay A L, Xiang Q S, Masri B., "Metal artifact reduction sequence: early clinical applications," Radiographics 2000; 20:699-712, Lee M J, Janzen D L, Munk P L, MacKay A, Xiang Q S, McGowen A., "Quantitative assessment of an MR technique for reducing metal artifact: application to spin-echo imaging in a phantom," Skeletal Radiol 2001; 30:398-401, and Kolind S H, MacKay A L, Munk P L, Xiang Q S., "Quantitative evaluation of metal artifact reduction techniques," J Magn Reson Imaging 2004; 20:487-495, which are all incorporated by reference for all purposes, and interventional devices such as needles, as described in Butts K, Pauly J M, Daniel B L, Kee S, Norbash A M., "Management of biopsy needle artifacts: techniques for RF-refocused MRI," J Magn Reson Imaging 1999; 9:586-95 and Duerk J L, Butts K, Hwang K P, Lewin J S. "Pulse sequences for interventional magnetic resonance imaging," Top Magn Reson Imaging 2000; 11:147-62, which are all incorporated by reference for all purposes, and cryoprobes, as described in Daniel B L, Butts K., "The use of view angle tilting to reduce distortions in magnetic resonance imaging of cryosurgery," Magn Reson Imaging 2000; 18:281-6, which is incorporated by reference for all purposes.

An elegantly simple example uses a gradient applied on the slice select axis during readout, with an amplitude equal to that of the slice select gradient, as shown in FIG. 2. FIG. 2 shows that the view angle tilting pulse sequence uses a gradient on the slice-select (z) axis during readout that is equal in amplitude to the slice-select gradient, to eliminate in-phase distortion.

Figure 3A:
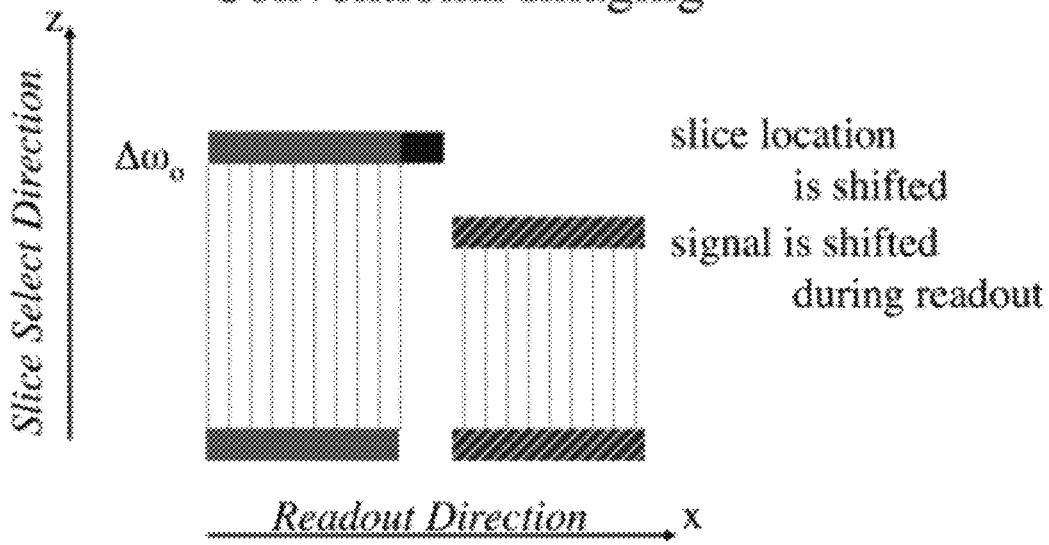
FIGS. 3A-B schematically demonstrate conventional MRI (FIG. 3A) and VAT MRI (FIG. 3B) for two tissues with different resonant frequencies such as adipose and aqueous tissues.
Figure 3B:
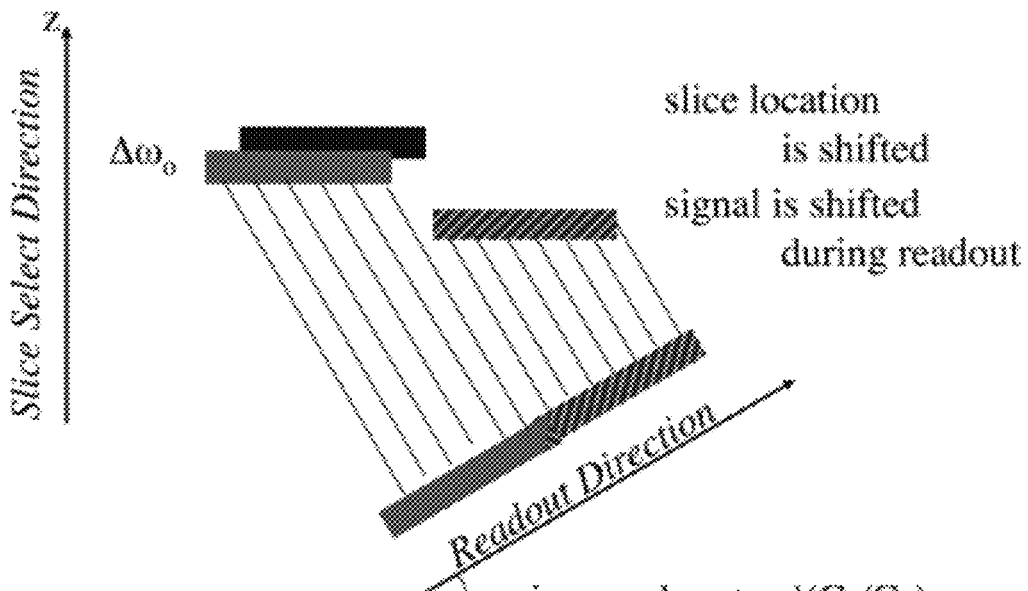

The slice is then effectively viewed at an angle $$\phi = \tan^{-1} \frac{G_z}{G_x},$$

which causes shifts in the slice-selection direction to exactly cancel shifts in the readout direction, as shown in FIGS. 3A-B. VAT is a powerful method because it registers all off-resonance spins in the image plane.

An alternative view of VAT is provided by playing the same slice-select gradient during the readout, the frequency of all spins in the excited slice is kept within the RF excitation bandwidth, which is low enough to avoid in-plane distortion beyond the tilt of the voxels shown in FIGS. 3A-B. FIGS. 3A-B schematically demonstrate conventional MRI (FIG. 3A) and VAT MRI (FIG. 3B) for two tissues with different resonant frequencies such as adipose tissue, on the left, and aqueous tissue, on the right. In conventional MRI, the original slice is shifted, then the signal is shifted during readout. Similarly, these shifts occur in VAT MRI, but the shifts compensate such that the two tissues appear to be registered in the images.

Figures 4A, 4B:
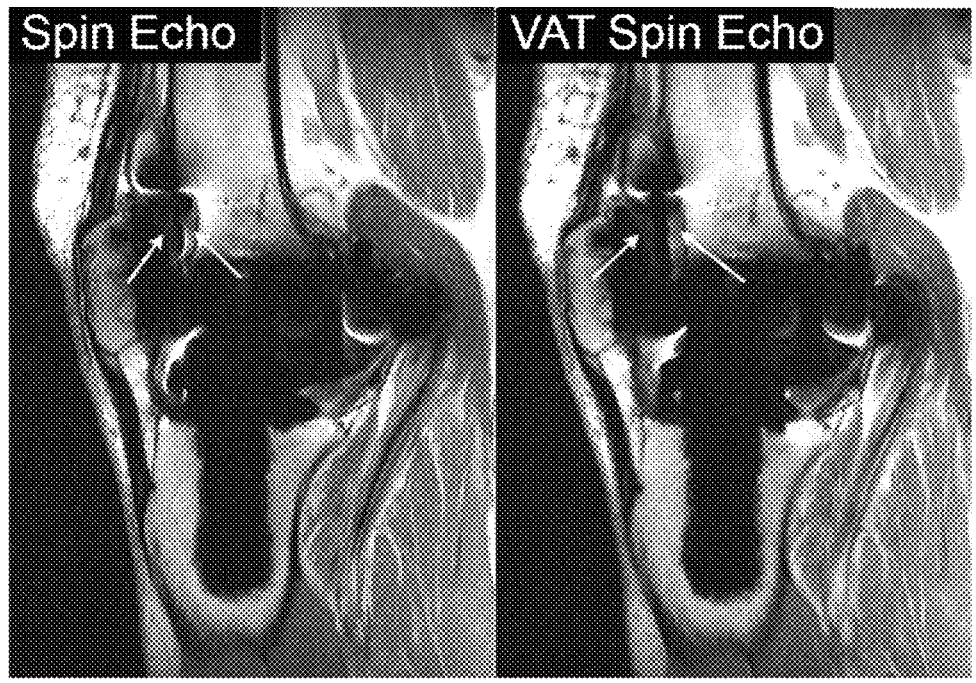
FIGS. 4A-B show images of a patient with a knee implant.

An example image comparison between standard FSE and VAT FSE is provided in FIGS. 4A-B. In these images of a patient with a knee implant, the VAT FSE image, FIG. 4B, eliminates the in-plane distortion that is shown in the FSE image, FIG. 4A. This study confirms that while in-plane distortion is eliminated, severe distortions nevertheless remain in the image, which are primarily from distortions in the slice-select direction. An embodiment of the invention provides techniques to eliminate both in-plane and through-slice distortions.

Technical Description

VAT with Complete Slice-Distortion Correction: An embodiment of the invention provides a method for complete elimination of both slice and in-plane distortions using a view angle tilting (VAT) sequence with additional phase encoding in the slice/slab direction. Techniques, called gradient-echo slice excitation profile imaging (GESEPI) or susceptibility MRI using spectral decomposition, have been proposed to resolve T2* effects with phase encoding in Yang Q X, Williams G D, Demeure R J, Mosher T J, Smith M B., "Removal of local field gradient artifacts in T2*-weighted images at high fields by gradient-echo slice excitation profile imaging," Magn Reson Med 1998; 39:402-409 and Ro Y M, Cho Z H., "Susceptibility magnetic resonance imaging using spectral decomposition," Magn Reson Med 1995; 33:521-528, which are incorporated by reference for all purposes. Resolved spins that otherwise lead to artifacts from field inhomogeneities can then be discarded. An embodiment of the invention, referred to as SEPI-VAT (slab excitation profile imaging with view angle tilting), applies a similar strategy to thin-slab VAT spin echo. However, rather than to only remove the artifacts, this embodiment's goal is to resolve and completely correct the distortions in 3D.

Figure 5A:
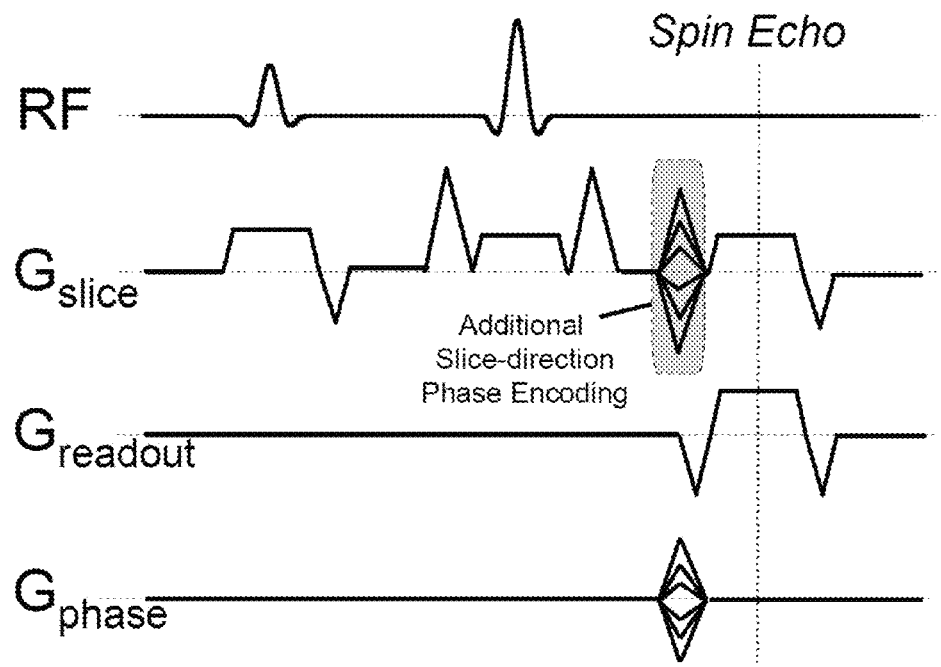

SEPI-VAT: As shown in FIG. 5A, the SEPI-VAT sequence extends the 2D VAT spin echo sequence with additional slice-direction phase encoding. The FOV of the slice-direction phase-encoded must cover the full range of "potato chip" distortions (i.e., through-slice distortions) of the current slice, as shown in FIG. 5B. Since phase-encoding is immune to distortions caused by the frequency shifts, it will allow us to resolve the actual slice-direction locations to the shaded gray sections as shown in FIG. 5B and FIG. 5C. In this sequence, the resolution of the slice-direction phase-encoding, rather than slice thickness, determines the section thickness. Thus we could actually replace the slices with thin slabs (thicker than slices) and reduce the total number of excited slabs needed as will be described shortly, and SEPI-VAT would actually be a 3D technique. The slice or slab widths and position must be carefully chosen such that all spins are excited exactly once, regardless of the frequency shifts. As FIG. 5C shows, it does not matter in which slice the spins are excited, their actual slice-selection locations (gray regions) can be resolved by the additional slice-select phase encoding, such as by resolving frequency offset. When the spins of all slices in the volume are resolved to their actual slice locations, simply summing the spins at the same location eliminates the through-slice distortion.

The SEPI-VAT sequence uses view angle tilting to remove in-plane distortions and additional phase-encoding to resolve the actual slice-select locations of the spins. Although frequency variations result in through-slice distortion as shown by the solid lines in FIG. 5B, the actual locations can be properly resolved by phase-encoding. When all slices in the volume are imaged with phase-encoding, as shown in FIG. 5C, each spin is excited in exactly one slice (or slab), and its position is properly resolved. When the spins of all slices in the volume are resolved to their actual slice locations, summing the spins at the same location eliminates the through-slice distortion. Hence, the SEPI-VAT sequence completely removes all distortions in the image.

EPSI-VAT: A similar, but alternative pulse sequence replaces slice-direction phase encoding with sampling of the $k_f$-axis (time axis) at multiple echo times. An efficient version of this is echo-planar spectroscopic imaging (EPSI), described in Posse S, DeCarli C, Le Bihan D., "Three-dimensional echo-planar MR spectroscopic imaging at short echo times in the human brain," Radiology 1994; 192:733-738, which is incorporated by reference for all purposes, which can be combined with VAT as shown in FIG. 6. FIG. 6 shows an EPSI-VAT imaging sequence, which is a 2D VAT sequence that includes a spectroscopic readout that can have both multiple echoes and multiple interleaves (dashed lines) to acquire the image with a sufficient number of echo times to resolve spectral information with appropriate spectral resolution and range to correct for through-slice distortions. By matching the spectral resolution to the slice RF bandwidth, the through-slice distortion is mapped to frequency in the same way as shown by FIGS. 5B-C. Thus a Fourier transform across echo times followed by summing the signal in different Fourier bins completely corrects the distortion.

An embodiment of the invention allows the speeding up of this process by up to 50% by subsampling part or all of $k_y$-$k_z$-space. This embodiment method can be used in conjunction with all conventional Slice Encoding for Metal Artifact Correction (SEMAC) scans including: 1) A basic scan, acquiring all of $k_y$-$k_z$-space with no other methods employed to reduce scan time; 2) A partial Fourier scan, where almost half of $k_y$-space is left unacquired; and 3) A parallel imaging scan, where the outer regions of k-space are subsampled.

EXAMPLE

Figure 7:
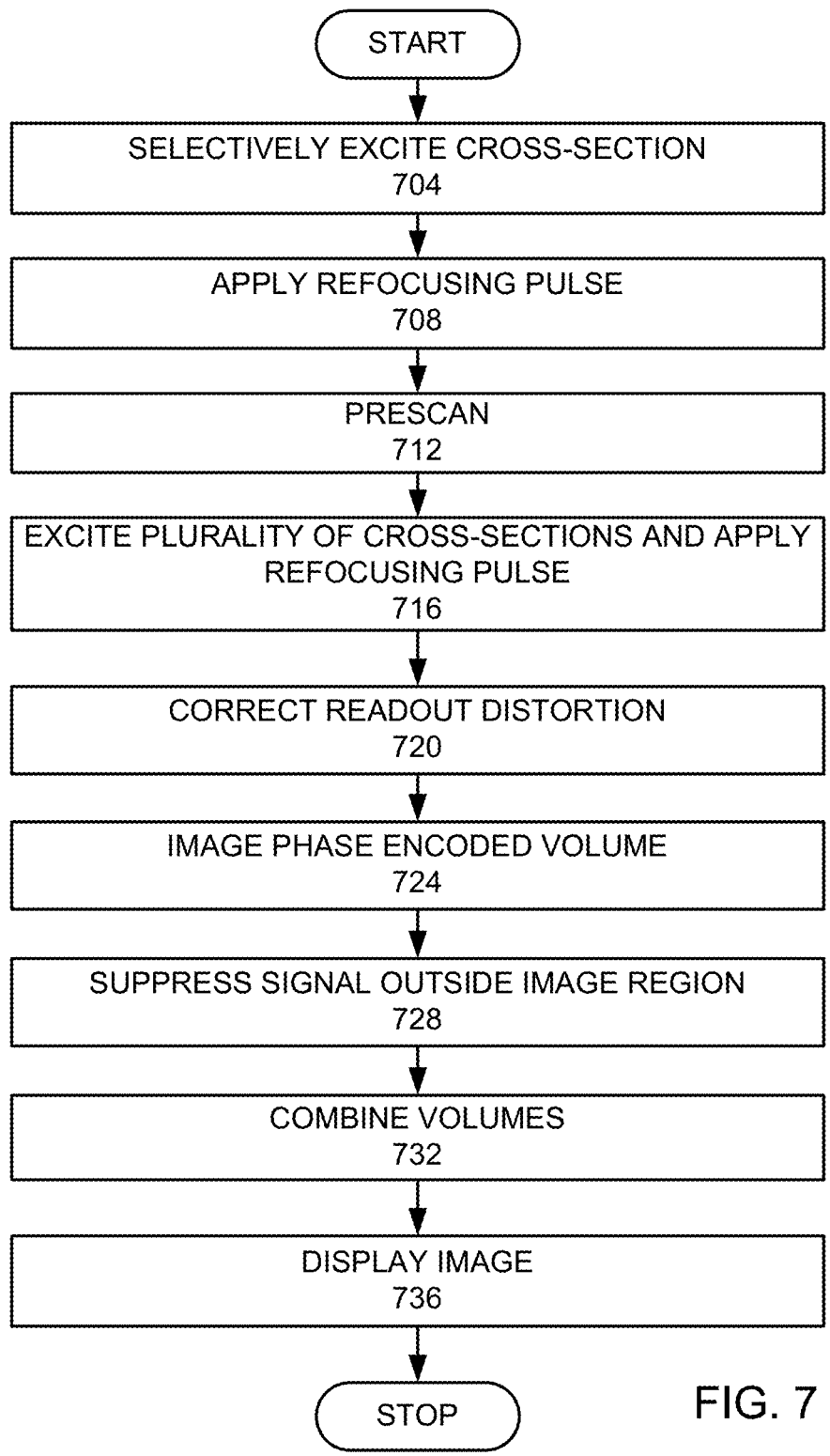
FIG. 7 is a high level flow chart of an embodiment of the invention.

To facilitate understanding, FIG. 7 is a high level flow chart of an embodiment of the invention. At least one cross-section is selectively excited using a RF pulse with a bandwidth (step 704). The cross-section may be a slice or a slab, which as discussed above, has a thickness of more than one slice. The selective cross-section has a thickness along a first axis. A refocusing pulse is applied to form a spin echo (step 708). Such a refocusing pulse may be reduced-flip angle refocusing pulses or a phase-compensated 90-180 pair. A spectral prescan is performed and used to predict distortion (step 712). A plurality of cross-sections is selectively excited with the application of a refocusing pulse (step 716). Readout distortion is corrected (step 720). This may be done by applying view angle tilting. This may also be done using post-processing, since resolving a slab shift or frequency shift makes it possible to deduce the in-plane shift from this information and "un-warp" the image to correct in-plane distortion. The phase encoded volume is imaged (step 724). The signal outside of an image region is suppressed (step 728). The volumes are combined (step 732). This may be done by encoding and resolving spectral information and using cross-section thickness and RF bandwidth to undo slice direction distortion. A Fourier encoding may be used to do this. A resulting image is displayed (step 736). The image is corrected for slice-direction distortion to allow an undistorted MRI near a metal object.

Figure 8:
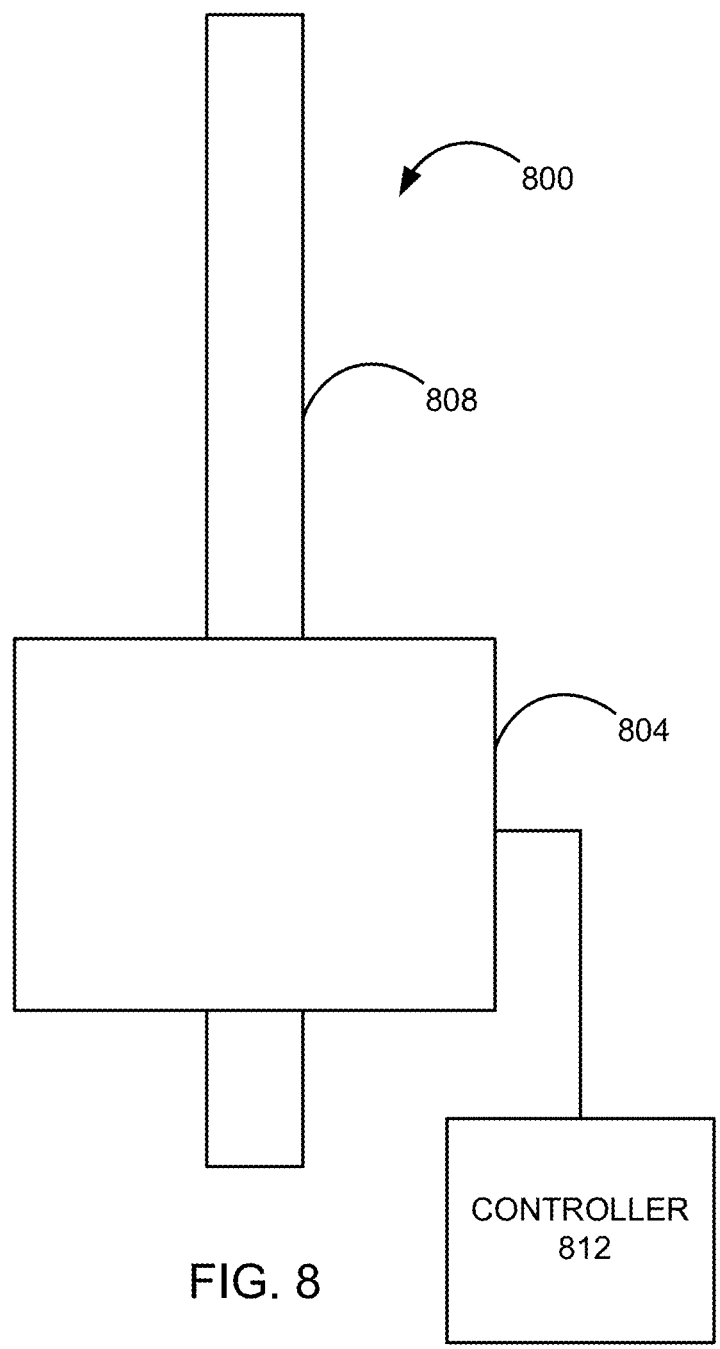
FIG. 8 is a schematic top view of a magnetic resonance imaging (MRI) system that may be used in an embodiment of the invention.

FIG. 8 is a schematic top view of a magnetic resonance imaging (MRI) system 800 that may be used in an embodiment of the invention. The MRI system 800 comprises a magnet system 804, a patient transport table 808 connected to the magnet system, and a controller 812 controllably connected to the magnet system. In one example, a patient would lie on the patient transport table 808 and the magnet system 804 would pass around the patient. The controller 812 would control magnetic fields and radio frequency (RF) signals provided by the magnet system 804 and would receive signals from detectors in the magnet system 804. In one embodiment, the magnet system 804 would use a single excitation coil to excite the first volume and the second volume. In another embodiment, the magnet system 804 would use multiple excitation coils to excite the first volume and the second volume.

Figure 9A:
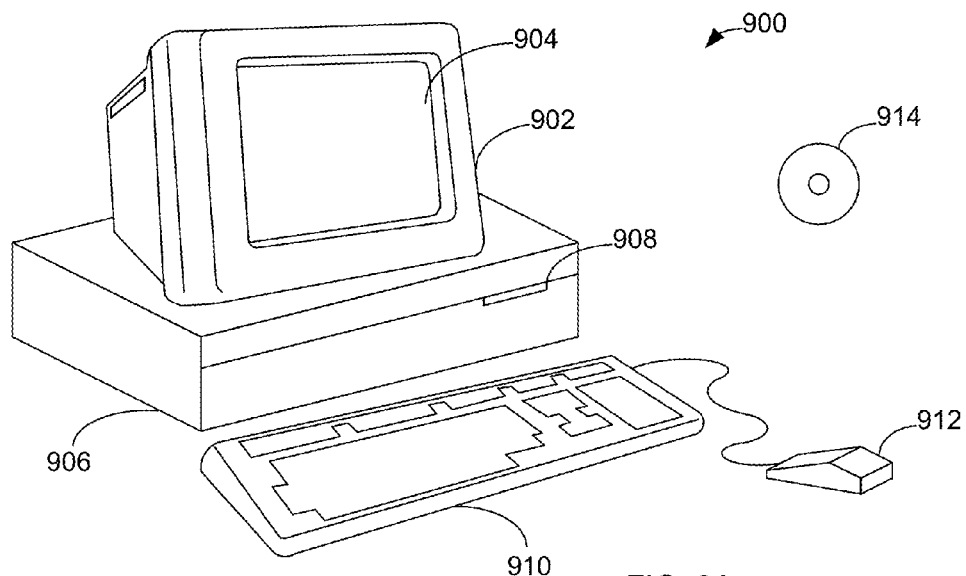
FIGS. 9A and 9B illustrate a computer system that may be used in an embodiment of the invention.
Figure 9B:
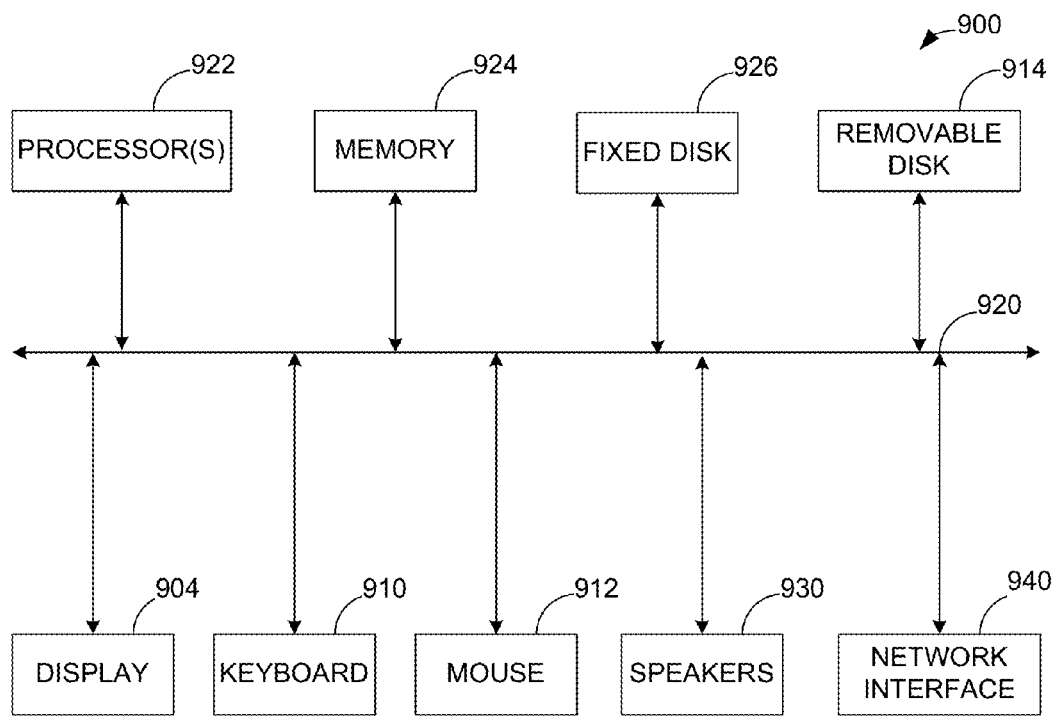

FIGS. 9A and 9B illustrate a computer system 900, which is suitable for implementing a controller 812 used in embodiments of the present invention. FIG. 9A shows one possible physical form of the computer system. Of course, the computer system may have many physical forms ranging from an integrated circuit, a printed circuit board, and a small handheld device up to a huge super computer. Computer system 900 includes a monitor 902, a display 904, a housing 906, a disk drive 908, a keyboard 910, and a mouse 912. Disk 914 is a computer-readable medium used to transfer data to and from computer system 900.

FIG. 9B is an example of a block diagram for computer system 900. Attached to system bus 920 are a wide variety of subsystems. Processor(s) 922 (also referred to as central processing units, or CPUs) are coupled to storage devices, including memory 924. Memory 924 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 926 is also coupled bi-directionally to CPU 922; it provides additional data storage capacity and may also include any of the computer-readable media described below. Fixed disk 926 may be used to store programs, data, and the like and is typically a secondary storage medium (such as a hard disk) that is slower than primary storage. It will be appreciated that the information retained within fixed disk 926 may, in appropriate cases, be incorporated in standard fashion as virtual memory in memory 924. Removable disk 914 may take the form of the computer-readable media described below.

CPU 922 is also coupled to a variety of input/output devices, such as display 904, keyboard 910, mouse 912, and speakers 930. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 922 optionally may be coupled to another computer or telecommunications network using network interface 940. With such a network interface, it is contemplated that the CPU might receive information from the network, or might output information to the network in the course of performing the above-described method steps. Furthermore, method embodiments of the present invention may execute solely upon CPU 922 or may execute over a network such as the Internet in conjunction with a remote CPU that shares a portion of the processing.

In addition, embodiments of the present invention further relate to computer storage products with a computer-readable medium that has computer code thereon for performing various computer-implemented operations. The media and computer code may be those specially designed and constructed for the purposes of the present invention, or they may be of the kind well known and available to those having skill in the computer software arts. Examples of tangible computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

In this example, the controller 812 may be used to generate and then display an image on the display 904.

Figure 10:
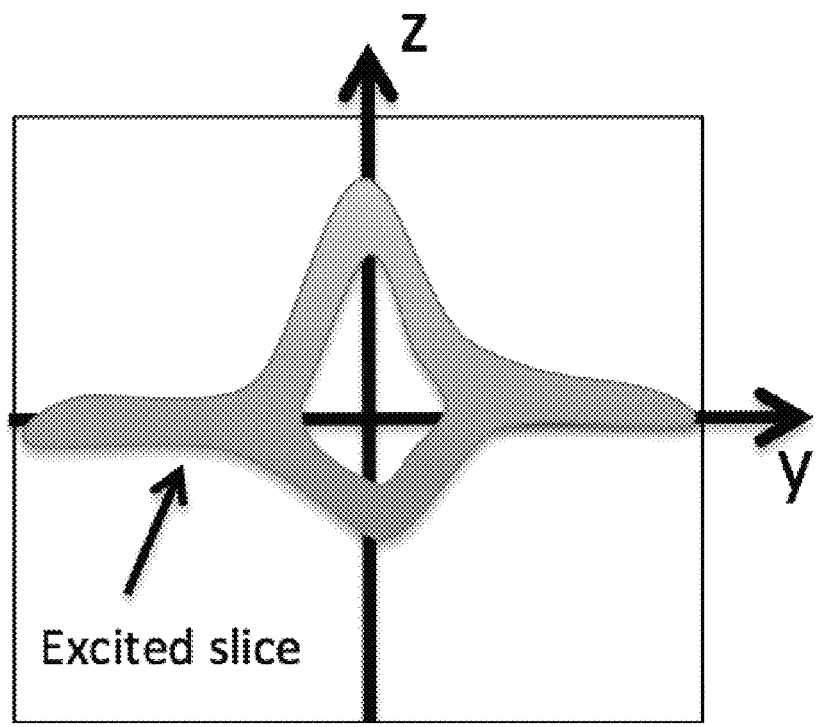
FIG. 10 illustrates an excited slice near metal experiences distortion including displacement, thickening, thinning, and splitting.
Figure 11:
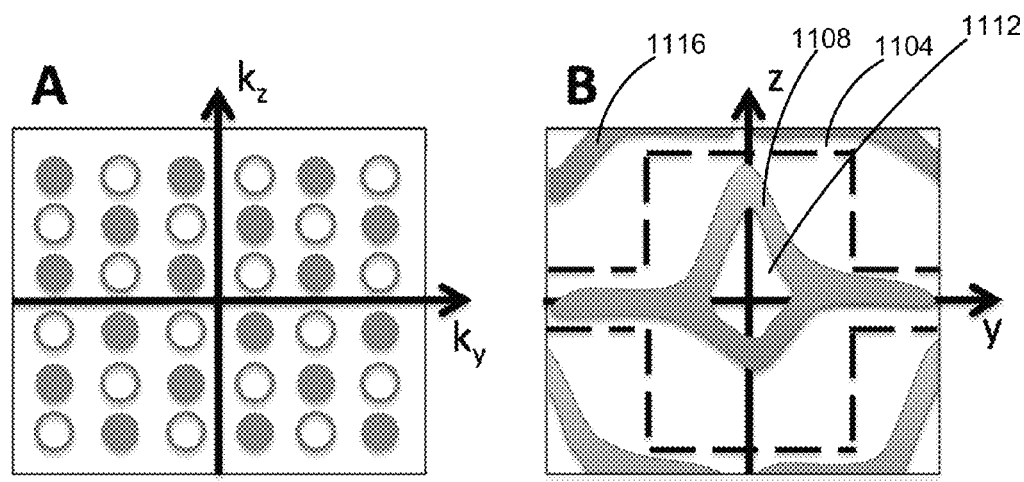
FIG. 11A illustrates phase encoded signals acquired in a checkerboard subsampling pattern in an embodiment of the invention.
FIG. 11B illustrates aliased copies of the image are packed in the same pattern.

In an example of an embodiment of the invention, The selective excitation of a cross-section (step 704), the application of the refocusing pulse (step 708), and the prescan (step 712) may be performed as described above or as described in U.S. Pat. No. 7,928,729 to Hargreaves et al., entitled DISTORTION-FREE MAGNETIC RESONANCE IMAGING NEAR METALLIC IMPLANTS, issued Apr. 19, 2011, which is incorporated by reference for all purposes. FIG. 10 illustrates an excited slice near metal experiences distortion including displacement, thickening, thinning, and splitting. A plurality of cross-sections are excited and a refocusing pulse is applied (step 716). The excitation of a plurality of cross-sections and application of a refocusing pulse provides the acquisition of a plurality of 2D encoded image signals that are phase encoded along a first axis and a third axis with a readout along a second axis, where data along the phase encoded first and third axes is acquired with reduced sampling. FIG. 11A illustrates phase encoded data with reduced sampling in a checkerboard pattern in an embodiment of the invention. Generally, a 2D checkerboard encoded image signal acquisition discards some or all of the (odd,even) and (even,odd) points within the fully sampled grid when numbered in a Cartesian fashion.

Readout distortion is corrected (step 720). In this example, view angle tilting is used to correct readout distortion. The image phase volume is encoded (step 724). In this example, aliased copies of the image are packed in the same pattern, as shown in FIG. 11B. Due to the limited extent of the image data in the acquired 3D volume, the images do not interfere with one another. This allows for aliased copies to be eliminated from each acquired volume before the volumes are finally combined together to form the image. The z-phase-encoded section with the desired image can be found deterministically based on slice position, or by detecting which section has the largest signal, summed over the entire x dimension and the central 50% in the y dimension. A region surrounding the image is kept intact, as a defined image region, while the rest of the data from the volume is eliminated. When partial Fourier or parallel imaging is employed in the scan and the central region of k-space was subsampled the central region is reconstructed separately in the same manner before the missing data in outer k-space is filled in with standard parallel imaging or partial-Fourier methods.

Figure 12:
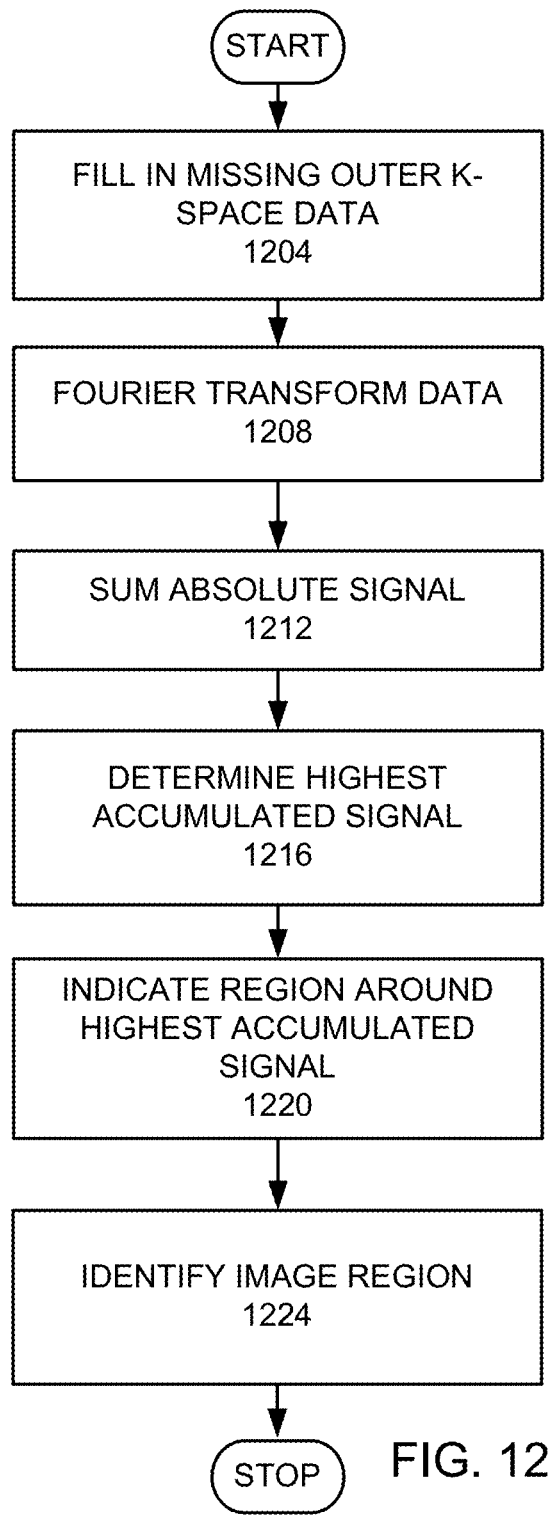
FIG. 12 is a more detailed flow chart of an algorithm for correcting slice-direction distortion.

FIG. 12 is a more detailed flow chart of an algorithm for imaging the phase encoded volume (step 724). If a 2D checkerboard encoded data set has a fully sampled center region, missing k-space data is filled in (step 1204) using appropriate methods, such as homodyne reconstruction for partial Fourier and ARC for parallel imaging. The volume data is Fourier-transformed in all directions to obtain image data (step 1208). The sum of the absolute signal is obtained over the whole range of x and the two center quadrants of y for each z phase-encode (step 1212). A determination is made for the z-phase-encode with the highest accumulated signal (step 1216). A region surrounding the slice found with the highest accumulated signal is indicated (step 1220). An image region is identified (step 1224). In FIG. 11B the indicated image region 1104 is bound between an inner region boundary 1108, which surrounds a highest distortion region 1112 and an outer region boundary 1116. In this example, the indicated image region 1104 is cross shaped, as shown.

The image signal outside of the image region 1104 is suppressed (step 728). In this example, areas outside of the indicated image region 1104 are zeroed out, thus creating a field of view (FOV) mask. The volumes are combined (step 732). In this example, the volume are the cross-sections, which are combined to make an image of the complete volume. The image is displayed (step 736).

Figure 13:
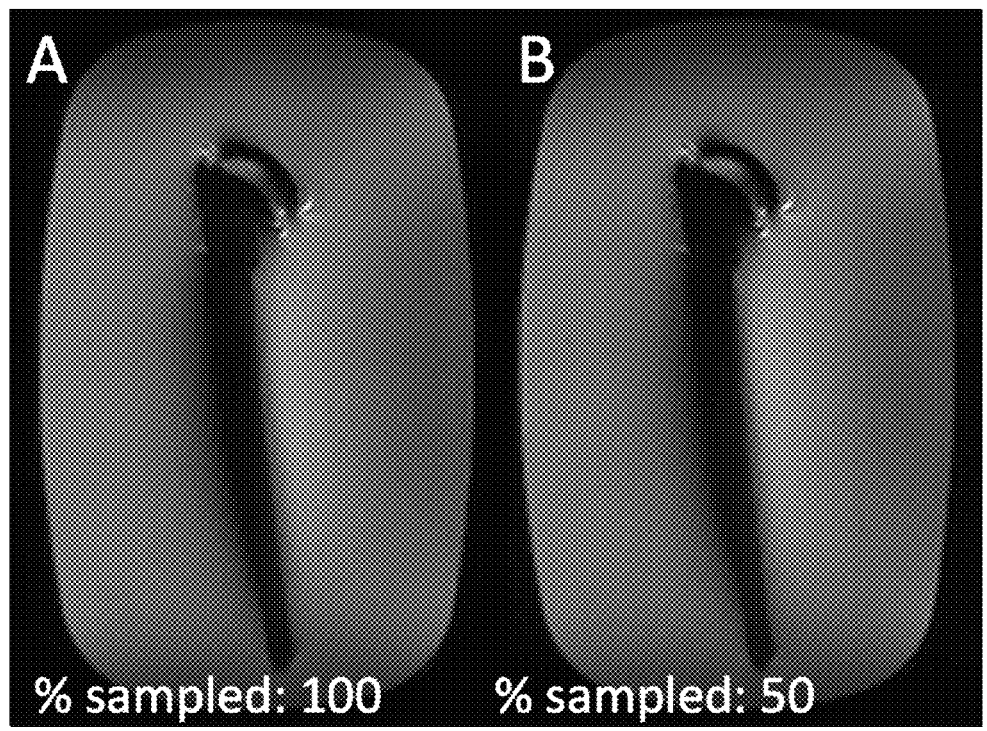
FIG. 13A is an image generated using full sampling of a titanium shoulder prosthesis in agar gel with a basic SEMAC scan.
FIG. 13B is an image generated using 50% sampling in an embodiment of the invention using checkerboard subsampling in $k_y$-$k_z$ space.

FIGS. 13A-B provide examples of an embodiment of the invention. FIG. 13A is an image generated using full sampling of a titanium shoulder prosthesis in agar gel with a basic SEMAC scan. FIG. 13B is a displayed image of an image generated using 50% sampling in an embodiment of the invention using checkerboard subsampling in $k_y$-$k_z$ space. The 50% sampling was able to provide as clear an image as full sampling. The reduction in the sampling requirement allows faster acquisition and a reduction of exposure of the metallic object to magnetic fields.

Figure 14:
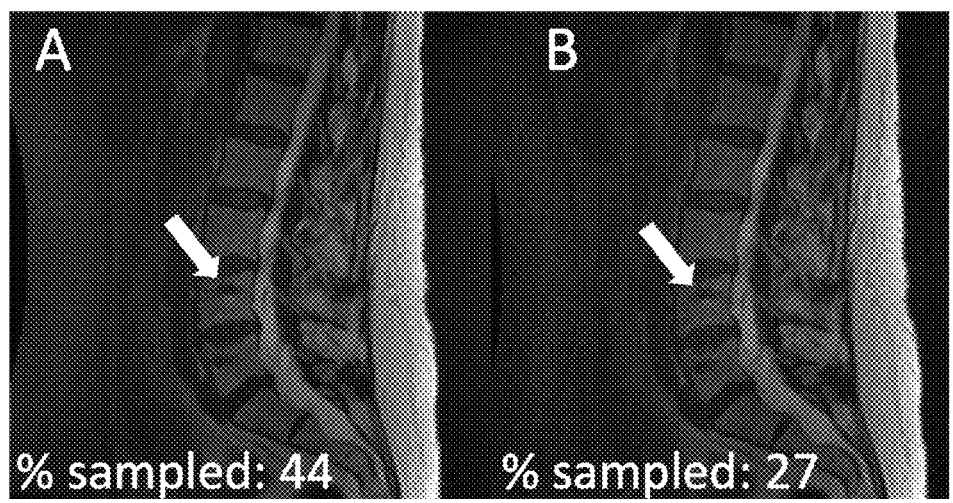
FIG. 14A is an image generated from the acquisition with a partial Fourier acquisition without a checkerboard pattern, so that 44% of $k_y$-$k_z$ space is acquired.
FIG. 14B is an image generated from the acquisition with a partial Fourier acquisition with a checkerboard pattern, so that 27% of $k_y$-$k_z$ space is acquired.

In another embodiment of the invention, spinal fixation hardware was imaged with a partial Fourier acquisition with 55% of the $k_y$ range sampled with the $k_y$-$k_z$ space acquired in an elliptical pattern. FIG. 14A is an image generated from the acquisition with a partial Fourier acquisition without a checkerboard pattern, so that 44% of $k_y$-$k_z$ space is acquired. FIG. 14B is an image generated from the acquisition with a partial Fourier acquisition with a checkerboard pattern, so that 27% of $k_y$-$k_z$ space is acquired. The arrows show the spinal fixation hardware. These images show that the reduction in sampling requirements by this embodiment of the invention does not reduce image resolution or increase distortion.

Figure 15:
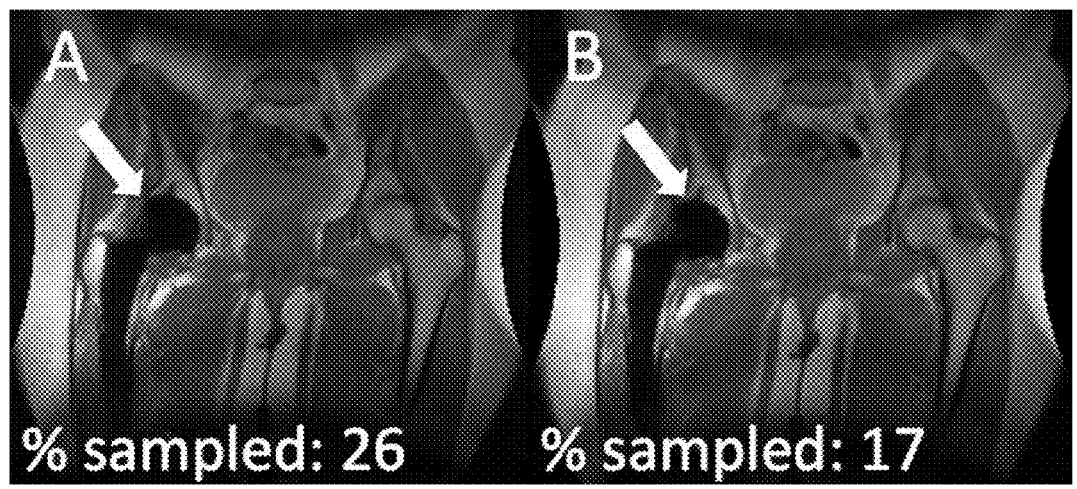
FIG. 15A is an image generated from the acquisition with 55% partial acquisition and 2× parallel imaging acceleration without a checkerboard pattern, so that 26% of $k_y$-$k_z$ space is acquired.
FIG. 15B is an image generated from the acquisition with 55% partial acquisition and 2× parallel imaging acceleration with a checkerboard pattern, so that 17% of $k_y$-$k_z$ space is acquired.

In another embodiment of the invention, a hip implant was acquired with 55% partial $k_y$ and 2× parallel imaging acceleration in $k_y$. FIG. 15A is an image generated from the acquisition with 55% partial acquisition and 2× parallel imaging acceleration without a checkerboard pattern, so that 26% of $k_y$-$k_z$ space is acquired. FIG. 15B is an image generated from the acquisition with 55% partial acquisition and 2× parallel imaging acceleration with a checkerboard pattern, so that 17% of $k_y$-$k_z$ space is acquired. The arrows show the titanium hip implant. These images show that the reduction in sampling requirements by this embodiment of the invention does not reduce image resolution or increase distortion.

In an embodiment, the range of frequencies in a slice or slab (cross-section) may be measured in a pre-scan by providing 90 degree and 180 degree pulses and then obtaining a free induction decay and then measuring the range of frequencies for the excited slice.

In another embodiment, a spectral scout scan, acquired by turning off readout gradients, can be used to quickly predict the "histogram" of distortions in a slice, as a function of y position. This can improve placement of the FOV mask. In another embodiment, the sampling scheme may be determined dynamically following a spectral scout scan. In another embodiment, the reconstruction does not assume that the implant is centered in the y FOV. Auto detection of the y-location of the largest "distortion" or the use of a spectral scout scan improves the placement of the y-z FOV mask. In another embodiment, the mask region may be allowed to vary with each excited slice, since the distortion of each slice will vary. In another embodiment, the subsampling and FOV-packing scheme can be modified to allow greater reductions in cases where the non-distorted region occupies a higher fraction than 50% in y. In another embodiment, when using parallel imaging or partial-Fourier methods, the central region can be subsampled in the same checkerboard manner and reconstructed by applying the full algorithm. Then, the outer k-space data can be reconstructed using the same steps. In another embodiment of the invention, the method is implemented with sequences of different contrast such as proton-density-weighted, T2-weighted, T1-weighted, inversion-recovery-prepared and fast-recovery fast spin echo, using sorted view-ordering schemes that are common in 3D echo-train methods. In another embodiment, additional acceleration techniques such as compressed sensing are also used. In another embodiment, a variable-z-FOV method is also used, where the number of phase encodes (and thus the z FOV) varies with the excited slice. Generally, numerous techniques can be used to offer reduced FOV imaging, including sampling patterns, parallel imaging and constrained reconstructions. Many of these methods, or their combinations, form other embodiments where the finite extent of distortion can be exploited in order to reduce encoding time for a given spatial resolution.

In other embodiments of the invention, checkerboard sampling may be replaced with other undersampling methods. In these embodiments, distortion is assumed to be large in a portion of the slice and small in other portions of the slice, so that the distorted slice has a finite extent in both y and z, so that other parts of the slice have minimal or no distortion, and "aliased replicas" are placed in the unused areas in the yz-plane. Checkerboard sampling puts "aliased replica" images diagonally, so that they are unlikely to interfere, and can be cropped away. In these other embodiments of the invention, other undersampling methods, such as parallel imaging, are used by fully sampling selected areas determined by high distortion and undersampling areas of low or no distortion. In all of these cases, the extent of the distorted slice in both y and z is limited, and knowledge of this, either by assumption or measurement, can be used in order to suppress the aliasing beyond this finite extent or region of support. Suppression of signal beyond the region of support will improve image quality and often enable undersampling methods that will speed up the scan.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method for 3D magnetic resonance imaging (MRI) with slice-direction distortion correction in an MRI system comprising a magnet system and a controller, comprising:
   a) exciting by the magnet system one or more selective cross-sections with a thickness along a first axis using a RF pulse with a bandwidth, wherein a selective cross-section is either a selective slice or selective slab;
   b) applying by the magnet system a refocusing pulse to form a spin echo;
   c) acquiring by the magnet system one or more 2D encoded image signals with readout along a second axis and phase encoding along a third axis, wherein data along the phase encoded first and third axes is acquired with reduced sampling;
   d) imaging by the controller a phase encoded volume by resolving a selective slice or selective slab position of the one or more selective cross-sections by using phase encoding; and
   e) suppressing by the controller the signal outside an image region along the phase encoded slice or slab in the first and third axes.

2. The method, as recited in claim 1, wherein the reduced sampling is performed using a checkerboard pattern.

3. The method, as recited in claim 2, wherein the imaging the phase encoded volume, comprises:
filling in unsampled data; and
transforming the data into image data.

4. The method, as recited in claim 3, wherein the imaging the phase encoded volume, further comprises:
determining which z phase-encoded section has a highest accumulated signal; and
defining an image region surrounding a slice with the z phase-encoded region with a highest accumulated signal.

5. The method, as recited in claim 4, wherein transforming the data into image data, comprises applying a Fourier transform to the data.

6. The method, as recited in claim 5, further comprising combining volumes.

7. The method, as recited in claim 6, wherein the acquiring one or more 2D encoded image signals, further comprises at least one of a partial Fourier acquisition or parallel imaging acceleration.

8. The method, as recited in claim 1, further comprising correcting by the controller readout distortion.

9. The method, as recited in claim 8, wherein correcting readout distortion comprises applying view angle tilting.

10. The method, as recited in claim 8, wherein the correcting readout distortion comprises using spectral information combined with readout bandwidth and pixel size to correct in-plane distortion.

11. The method, as recited in claim 1, wherein excited cross-section thickness varies to maintain a relatively constant frequency variation within the excited cross-section.

12. The method, as recited in claim 1, further comprising measuring the frequency spectrum to predict distortion using a spectral prescan.

13. The method, as recited in claim 1, wherein the excitation-refocusing pulses are a matched-phase pulse pair with individual pulses not necessarily having linear phase.

14. The method, as recited in claim 1, wherein the phase encoding comprises using echo-planar spectroscopic imaging.

15. The method, as recited in claim 1, wherein step d comprises applying additional phase encoding along the first axis to correct slice-direction distortion by resolving an actual location.

16. The method, as recited in claim 1, further comprising displaying a 3D magnetic resonance image with slice-direction distortion correction.

17. An apparatus for providing 3D magnetic resonance imaging with slice-direction distortion compensation, comprising:
a magnetic resonance imaging excitation and detection system; and
a controller electrically connected to the magnetic resonance imaging excitation and detection system, comprising:
a display;
at least one processor; and
computer readable media, comprising:
computer readable code for exciting one or more selective cross-sections with a thickness along a first axis using a RF pulse with a bandwidth, wherein a selective cross-section is either a selective slice or selective slab;
computer readable code for applying a refocusing pulse to form a spin echo;
computer readable code for acquiring one or more 2D encoded image signals with readout along a second axis and phase encoding along a third axis, wherein data along the phase encoded first and third axes is acquired with reduced sampling;
computer readable code for imaging a phase encoded volume by resolving a selective slice or selective slab position of the one or more selective cross-sections by using phase encoding;
computer readable code for suppressing a signal outside an image region along the phase encoded slice or slab in the first and third axes; and
computer readable code for displaying a 3D magnetic resonance image with slice-direction distortion correction on the display.

18. The apparatus, as recited in claim 17, wherein the reduced sampling is performed using a checkerboard pattern.

19. The apparatus, as recited in claim 18, wherein the computer readable code for imaging the phase encoded volume, comprises:
computer readable code for filling in unsampled data; and
computer readable code for transforming the data into image data.

* * * * *